US012602824B2

(12) United States Patent
Lee et al.

(10) Patent No.: US 12,602,824 B2
(45) Date of Patent: Apr. 14, 2026

(54) SUBSTRATE TREATING APPARATUS AND SUBSTRATE TREATING METHOD

(71) Applicant: SEMES CO., LTD., Cheonan-si (KR)

(72) Inventors: Ho Hun Lee, Suwon-si (KR); Yong Seok Jang, Cheonan-si (KR)

(73) Assignee: Semes Co., LTD., Cheonan-si (KR)

( * ) Notice: Subject to any disclaimer, the term of this patent is extended or adjusted under 35 U.S.C. 154(b) by 292 days.

(21) Appl. No.: 18/311,014

(22) Filed: May 2, 2023

(65) Prior Publication Data

US 2024/0153135 A1     May 9, 2024

(30) Foreign Application Priority Data

Nov. 9, 2022    (KR) ........................ 10-2022-0149025

(51) Int. Cl.
| | |
|---|---|
| *G06T 7/73* | (2017.01) |
| *G06T 5/70* | (2024.01) |
| *G06T 7/00* | (2017.01) |
| *G06V 10/25* | (2022.01) |
| *H01J 37/32* | (2006.01) |

(52) U.S. Cl.
CPC .................. *G06T 7/74* (2017.01); *G06T 5/70* (2024.01); *G06T 7/001* (2013.01); *G06V 10/25* (2022.01); *H01J 37/32642* (2013.01); *G06T 2207/30148* (2013.01); *H01J 2237/24578* (2013.01)

(58) Field of Classification Search
CPC .. G06T 7/74; G06T 5/70; G06T 7/001; G06T 2207/30148; G06V 10/25; H01J 37/32642; H01J 2237/24578
See application file for complete search history.

(56) References Cited

U.S. PATENT DOCUMENTS

| | | | |
|---|---|---|---|
| 2009/0059228 A1* | 3/2009 | Horie ...................... | G01J 3/447 |
| | | | 356/369 |
| 2012/0307041 A1* | 12/2012 | Fujiwara ............ | G01N 21/8422 |
| | | | 348/E5.049 |
| 2020/0242796 A1* | 7/2020 | Yamada ................ | G06T 7/0008 |

FOREIGN PATENT DOCUMENTS

| | | | | |
|---|---|---|---|---|
| JP | 2002092625 A | * | 3/2002 | .......... G06T 15/506 |
| JP | 2013157360 A | * | 8/2013 | |
| KR | 10-2006-0003709 A | | 1/2006 | |

(Continued)

OTHER PUBLICATIONS

Office Action for Korean Application No. 10-2022-0149025 dated Apr. 24, 2024.

*Primary Examiner* — Pinalben Patel
(74) *Attorney, Agent, or Firm* — Harness, Dickey & Pierce, P.L.C.

(57) ABSTRACT

Embodiments of the inventive concept provide a substrate treating apparatus and a substrate treating method for allowing a position of a substrate to be known with only an analysis of an image with respect to a light source irradiated to a surrounding of the substrate. The inventive concept provides a substrate treating apparatus. The substrate treating apparatus includes a support unit configured to seat a substrate; a first light irradiation unit configured to irradiate a first light source to the substrate; an image acquisition unit configured to acquire an image information with respect to the first light source irradiated to the substrate; and an image analysis unit configured to detect a position of the substrate by inputting the image information and analyzing the first light source irradiated to the substrate within the image information which is input.

12 Claims, 7 Drawing Sheets

(56) References Cited

FOREIGN PATENT DOCUMENTS

| KR | 100936506 | B1 | | 1/2010 | | |
|---|---|---|---|---|---|---|
| KR | 102046081 | B1 | * | 12/2019 | .......... | G01N 21/892 |
| KR | 10-2020-0004439 | A | | 1/2020 | | |
| KR | 20200004439 | A | * | 1/2020 | ........ | H01J 37/32642 |
| KR | 102239052 | B1 | | 4/2021 | | |
| KR | 10-2022-0062186 | A | | 5/2022 | | |

* cited by examiner

FIG. 2

SUBSTRATE TREATING APPARATUS AND SUBSTRATE TREATING METHOD

CROSS-REFERENCE TO RELATED APPLICATIONS

A claim for priority under 35 U.S.C. § 119 is made to Korean Patent Application No. 10-2022-0149025 filed on Nov. 9, 2022, in the Korean Intellectual Property Office, the entire contents of which are hereby incorporated by reference.

TECHNICAL FIELD

Embodiments of the inventive concept described herein relate to a substrate treating apparatus and a substrate treating method, more specifically, a substrate treating apparatus and a substrate treating method for detecting a position of a substrate.

BACKGROUND

In performing each process such as exposure, etching, and deposition, semiconductor and display devices need to transfer wafers or masks to process chambers or inspection devices. These wafers or masks are placed by precisely adjusting the final seating position of wafers or masks.

Here, wafers or masks may be placed outside the error range. The method of inspecting the wafer or mask position is to detect the outer position of the wafer or mask using a position detection sensor, obtain image information of the wafer or mask through a vision image, and analyze the obtained image information to determine the location of the wafer or mask.

In this case, the method of determining the location of a wafer or mask through vision images has a problem of high cost because the image analysis algorithm must be redesigned whenever the size of the wafer or mask changes or the shape of the structure placed around the wafer or mask changes.

SUMMARY

Embodiments of the inventive concept provide a substrate treating apparatus and a substrate treating method for allowing a position of a substrate to be known with only an analysis of an image with respect to a light source irradiated to a surrounding of the substrate.

Embodiments of the inventive concept provide a substrate treating apparatus and a substrate treating method which can be used without a modification of an image analysis algorithm even if a form of a substrate or a surrounding structure is modified.

The technical objectives of the inventive concept are not limited to the above-mentioned ones, and the other unmentioned technical objects will become apparent to those skilled in the art from the following description.

The inventive concept provides a substrate treating apparatus. The substrate treating apparatus includes a support unit configured to seat a substrate; a first light irradiation unit configured to irradiate a first light source to the substrate; an image acquisition unit configured to acquire an image information with respect to the first light source irradiated to the substrate; and an image analysis unit configured to detect a position of the substrate by inputting the image information and analyzing the first light source irradiated to the substrate within the image information which is input.

In an embodiment, the substrate treating apparatus further includes: a ring member positioned around the support unit; and a second light source unit configured to irradiate a second light source to the ring member, and wherein the image acquisition unit further acquires an image information with respect to the ring member at which the second light source is irradiated to, and the image analysis unit detects a position of the ring member by being input with an image information of the ring member irradiating the second light source, analyzing the second light source which is irradiated to the ring member within the image information which is input.

In an embodiment, the first light source is formed of a first line light source which is irradiated in a line form to the substrate, and a second line light source which is irradiated in a line form to the ring member.

In an embodiment, the first line light source is irradiated in a diagonal direction to the substrate, and the second line light source is irradiated in a diagonal direction to the ring member.

In an embodiment, the ring member further includes a step which is formed in a substrate direction, and the second line light is formed in an intersection point from which the step starts to the other direction, if irradiated to the ring member.

In an embodiment, the image analysis unit calculates a separation value of how much an extracted distance value, which is a distance value from a point at which the first light source ends on the substrate within the image information and the intersection point, is spaced apart from a reference distance value.

In an embodiment, the image analysis unit further includes a line extraction unit which generates a line image by applying a noise filter and removing a noise element which has greatly deviated from a line center of the first line light source and a second line light source, in a state in which an R channel and a G channel is coupled in an RGB channel of an image information which is input from the image acquisition unit so a region except from the first line light source and the second line light source is configured to be a black region.

In an embodiment, the image analysis unit further includes a binarization unit for binarizing a region at which the first line light source and the second line light source exist within an input line image to be white, and a region at which the first line light source and the second line light do not exist to be black, once the line image is input by communicating with the line extraction unit.

In an embodiment, the image analysis unit further includes a region separation unit which is input with a coordinate image from the binarization unit and divides the coordination image which is input to a first interest region image at which the first line light source exists and a second interest region image at which the second line light source exists.

In an embodiment, the image analysis unit includes: a substrate region position detection unit which detects a position of the substrate by being input with the first interest region image from the region separation unit and then detecting through a coordinate value of a point at which the first line light source ends within the first interest region image, and a ring member region position detection unit which detects a position of the ring member by being input with the second interest region image from the region separation unit and then detecting through a coordinate value of a point at which the second line light sources intersect with each other within the second interest region image.

In an embodiment, the image analysis unit further includes a substrate distance calculation unit which calculates a distance value between a coordinate value of a point at which the first line light source ends which is detected at the substrate region position detection unit, and a coordinate value of a point at which the second line light sources intersect with each other which is detected at the ring member region position detection unit.

In an embodiment, the image analysis unit further includes a substrate position adjustment unit which aligns to thereby adjust the position of the substrate by transmitting a separation value to a transfer apparatus for adjusting the position of the substrate, if the separation value is calculated by calculating how much the distance value calculated through the substrate distance calculation unit deviates from a predetermined deviation value, and the calculated separation value deviates from the predetermined deviation value.

The inventive concept provides a substrate treating method. The substrate treating method includes irradiating a first line light source from a first light irradiation unit to a substrate and irradiating a second line light source to a ring member from a second light irradiation unit; acquiring of an image information by imaging the substrate and the ring member by the image acquisition member; and transferring a separation value to a transfer apparatus to adjust a position of the substrate, by inputting an image information to an image analysis unit from an image acquisition unit by communicating with the image acquisition unit, extracting a distance value between an outermost region of the substrate and an inner side region of the ring member by analyzing the first line light source and the second line light source within the image information which is input, and calculating the separation value which deviates to a certain degree from an extracted distance value to a reference distance value.

In an embodiment, the transferring the separation value further includes generating a line image by applying a noise filter and removing a noise element which has greatly deviated from a line center of the first line light source and a second line light source, in a state in which an R channel and a G channel is coupled in an RGB channel of an image information which is input from the image acquisition unit by a line extraction unit so a region except from the first line light source and the second line light source is configured to be a black region.

In an embodiment, the transferring the separation value further includes binarizing a region at which the first line light source and the second line light source exist within an input line image to be a first color, and a region at which the first line light source and the second line light do not exist to be a second color, once the line image is input by a binarization unit communicating with the line extraction unit.

In an embodiment, the transferring the separation value further includes separating a region by a region separation unit which is input with a coordinate image from the binarization unit and divides into a first interest region image at which the first line light source exists and a second interest region image at which the second line light source exists.

In an embodiment, the transferring the separation value further includes detecting a substrate position through a rightmost coordination value which is a point at which the first line light source ends within the first interest region image, once the first interest region image is input from the region separation unit by a substrate region position detection unit.

In an embodiment, the transferring the separation value further includes detecting a ring member position through a coordinate value of a point at which the second line light sources intersect with each other within the second interest region image, once the second interest region image is input from the region separation unit by a ring member region position detection unit.

In an embodiment, the transferring the separation value further includes: calculating a distance value by the substrate distance calculation unit between a coordinate value of a point at which the first line light source ends which is detected at the substrate region position detection unit, and a coordinate value of a point at which the second line light sources intersect with each other which is detected at the ring member region position detection unit; and aligning to thereby adjust the position of the substrate by transmitting the separation value to the transfer apparatus for adjusting the position of the substrate, if the separation value is calculated by calculating how much the distance value calculated through the substrate distance calculation unit deviates from a predetermined deviation value, and the calculated separation value deviates from the predetermined deviation value.

The inventive concept provides a substrate treating apparatus. The substrate treating apparatus includes a support unit configured to seat a substrate; a first light irradiation unit configured to irradiate a first light source in a line form to the substrate in a diagonal direction; a ring member positioned around the support unit and having a step formed in an inner edge; a second light source unit configured to irradiate a second light source in a line form in a diagonal direction and so an intersection is formed so a direction of the second light source is bent in another direction at a point at which the step starts; an image acquisition unit configured to acquire an image information of the first light source which is irradiated to the substrate and the second light source which is irradiated to the ring member; and an image analysis unit including: a line extraction unit which generates a line image by applying a noise filter and removing a noise element which has greatly deviated from a line center of the first light line source and a second line light source, in a state in which an R channel and a G channel is coupled in an RGB channel of an image information which is input from the image acquisition unit so a region except from the first line light source and the second line light source is configured to be a black region; a binarization unit for binarizing a region at which the first line light source and the second line light source exist within an input line image to be a first color, and a region at which the first line light source and the second line light do not exist to be a second color, after the line image is input by communicating with the line extraction unit; a region separation unit which is input with a coordinate image from the binarization unit and divides the coordination image which is input to a first interest region at which the first line light source exists and a second interest region at which the second line light source exists; a substrate region position detection unit which detects a position of the substrate by being input with the first interest region image from the region separation unit and then detecting through a coordinate value of a point at which the first line light source ends within the first interest region image; a ring member region position detection unit which detects a position of the ring member by being input with the second interest region image from the region separation unit and then detecting through a coordinate value of a point at which the second line light sources intersect with each other within the second interest region image; a substrate distance calculation unit which calculates a distance value between a coordinate value of a point at which the first line light source ends which is detected at the substrate region position detection unit, and a point at which the second line light sources intersect with each other which is detected at the ring member region position detection unit; and a substrate position adjustment unit which aligns to thereby adjust the position of the substrate by transmitting a separation value to a transfer apparatus for adjusting the position of the substrate, if the separation value is calculated by calculating how much the distance value calculated through the substrate distance calculation unit deviates from a predetermined deviation value, and the calculated separation value deviates from the predetermined deviation value.

According to an embodiment of the inventive concept, a position of a substrate may be known with only an analysis of an image with respect to a light source irradiated to a surrounding of the substrate.

According to an embodiment of the inventive concept, even if a form of a substrate or a surrounding structure is modified, the embodiment may be used without a modification of an image analysis algorithm.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 2 is a cross-sectional view of a process chamber shown in FIG. 1.

DETAILED DESCRIPTION

Figure 1:
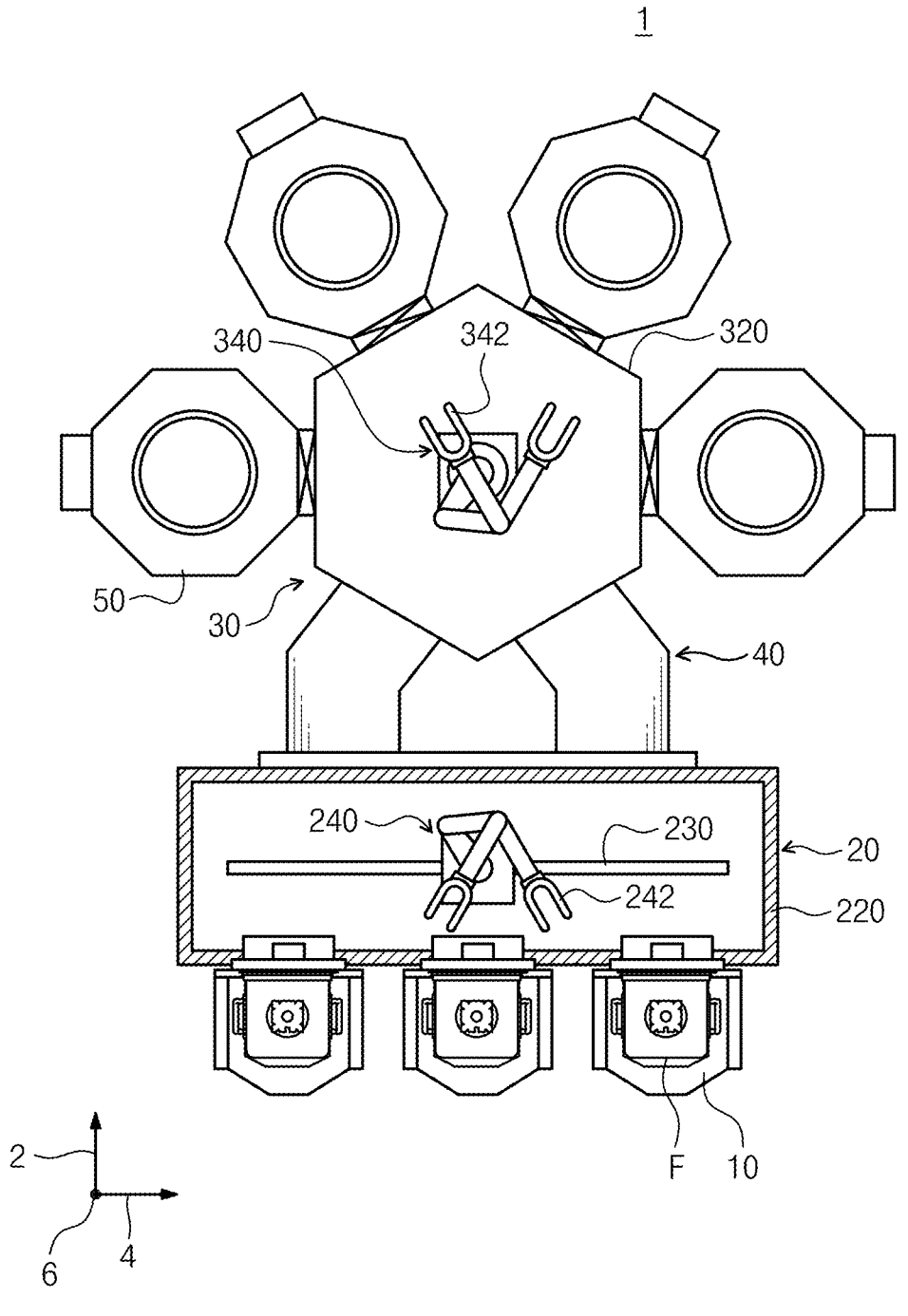
FIG. 1 is a schematic plan view of a substrate treating apparatus according to an embodiment of the inventive concept.

Example embodiments will now be described more fully with reference to the accompanying drawings. Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

When the term "same" or "identical" is used in the description of example embodiments, it should be understood that some imprecisions may exist. Thus, when one element or value is referred to as being the same as another element or value, it should be understood that the element or value is the same as the other element or value within a manufacturing or operational tolerance range (e.g., ±10%).

When the terms "about" or "substantially" are used in connection with a numerical value, it should be understood that the associated numerical value includes a manufacturing or operational tolerance (e.g., ±10%) around the stated numerical value. Moreover, when the words "generally" and "substantially" are used in connection with a geometric shape, it should be understood that the precision of the geometric shape is not required but that latitude for the shape is within the scope of the disclosure.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

FIG. 1 is a schematic plan view of a substrate treating apparatus according to an embodiment of the inventive concept. Referring to FIG. 1, the substrate treating apparatus 1 according to an embodiment of the inventive concept may include a load port 10, an atmospheric pressure transfer module 20, a vacuum transfer module 30, a load lock chamber 40, and a process chamber 50.

The load port 10 may be disposed on a side of the atmospheric pressure transfer module 20 to be described later. At least one load port 10 may be disposed on a side of the atmospheric pressure transfer module 20. The number of load ports 10 may increase or decrease according to a process efficiency and footprint conditions.

The container F may be placed in the load port 10. The container F may be loaded into the load port 10 or unloaded from the load port 10 by a means of transport (not shown) such as an overhead transfer apparatus (OHT), an overhead conveyor, or an automatic guided vehicle or an operator. The container F may include various types of containers according to a type of articles to be stored. The container F may be a sealed container such as a front opening unified pod (FOUP).

The atmospheric pressure transfer module 20 and the vacuum transfer module 30 may be disposed along a first direction 2. Here, the first direction 2 is perpendicular to a second direction 4, and a surface including the first direction 2 and the second direction 4 is defined as a plane parallel to the ground. In addition, a direction perpendicular to a plane including the first direction 2 and the second direction 4 will be defined as a third direction 6. In addition, a surface including the second direction 4 and the third direction 6 is defined as a front surface, a surface including the first direction 2 and the third direction 6 is defined as a left side surface, and a set of six drawings is defined based on the front surface, the plane, and the left side surface. In this case, the terms of a top/above and a bottom/below will be described based on the third direction 6 perpendicular to the plane.

The atmospheric pressure transfer module 20 may transfer the substrate W between the container F and the load lock chamber 40 to be described later. According to an embodiment, the atmospheric pressure transfer module 20 may take out the substrate W from the container F and transfer the substrate W to the load lock chamber 40, or may take out the substrate W from the load lock chamber 40 and transfer the substrate W to an inside of the container F.

The atmospheric pressure transfer module 20 may include a transfer frame 220 and a first transfer robot 240. The transfer frame 220 may be disposed between the load port 10 and the load lock chamber 40. The load port 10 may be connected to the transfer frame 220. An atmosphere within the transfer frame 220 may maintain an atmospheric pressure. According to an embodiment, an inside of the transfer frame 220 may be formed in the atmospheric pressure atmosphere.

The transfer rail 230 is disposed on the transfer frame 220. A lengthwise direction of the transfer rail 230 may be horizontal to a lengthwise direction of the transfer frame 220. The first transfer robot 240 may be positioned on the transfer rail 230.

The first transfer robot 240 may transfer the substrate W between the container F seated on the load port 10 and the load lock chamber 40 to be described later. The first transfer robot 240 may forwardly and backwardly move in the second direction 4 along the transfer rail 230. The first transfer robot 240 may move in a vertical direction (e.g., third direction 6). The first transfer robot 240 has a first transfer hand 242 which forwardly moves, backwardly moves, or rotates on a horizontal plane. The substrate W is placed on the first transfer hand 242. The first transfer robot 240 may have a plurality of first transfer hands 242. The plurality of first transfer hands 242 may be disposed to be spaced apart from each other in the vertical direction.

The vacuum transfer module 30 may be disposed between the load lock chamber and the process chamber 50 to be described later. The vacuum transfer module 30 may include a transfer chamber 320 and a second transfer robot 340.

An inner atmosphere of the transfer chamber 320 may be maintained at a vacuum pressure. The second transfer robot 340 may be disposed in the transfer chamber 320. For example, the second transfer robot 340 may be disposed at a center of the transfer chamber 320. The second transfer robot 340 transfers the substrate W between the load lock chamber 40 and the process chamber 50 to be described later. In addition, the second transfer robot 340 may transfer the substrate W between the process chambers 50.

The second transfer robot 340 may move in a vertical direction (e.g., the third direction 6). The second transfer robot 340 may have a second transfer hand 342 which forwardly moves, backwardly moves, or rotates on the horizontal plane. The substrate W is placed on a second transfer hand 342. The second transfer robot 340 may have a plurality of second transfer hands 342. The plurality of second transfer hands 342 may be disposed to be spaced apart from each other in the vertical direction.

At least one process chamber 50 to be described later may be connected to the transfer chamber 320. According to an embodiment, the transfer chamber 320 may have a polygonal shape. The load lock chamber 40 to be described later and the process chamber 50 to be described later may be disposed around the transfer chamber 320. For example, as shown in FIG. 1, a hexagonal transfer chamber 320 may be disposed at a center of the vacuum transfer module 30, and the load lock chamber 40 and the process chamber 50 may be disposed along its circumference. Unlike those mentioned above, the shape of the transfer chamber 320 and the number of process chambers 50 can be variously changed depending on user requirements or process requirements.

The load lock chamber 40 may be disposed between the transfer frame 220 and the transfer chamber 320. The load lock chamber 40 has a buffer space in which the substrate W is exchanged between the transfer frame 220 and the transfer chamber 320. For example, a substrate W on which a predetermined treatment is completed in the process chamber 50 may temporarily remain in the buffer space of the load lock chamber 40. In addition, the substrate W, which is taken from the container F and which is scheduled for a predetermined treatment, may temporarily remain in the buffer space of the load lock chamber 40.

As described above, the inner atmosphere of the transfer frame 220 may be maintained at the atmospheric pressure, and the inner atmosphere of the transfer chamber 320 may be maintained at a vacuum pressure. Accordingly, the load lock chamber 40 is disposed between the transfer frame 220 and the transfer chamber 320, so that the inner atmosphere thereof can be switched between the atmospheric pressure and the vacuum pressure.

The process chamber 50 is connected to the transfer chamber 320. There may be a plurality of process chambers 50. The process chamber 50 may be a chamber which performs a predetermined process on the substrate W. According to an embodiment, the process chamber 50 may treat the substrate W using a plasma. For example, the process chamber 50 may be an etching process using the plasma to remove a thin film on the substrate W, an ashing process to remove a photoresist film, a deposition process to form the thin film on the substrate W, a dry cleaning process, an Atomic Layer Deposition (ALD) process to deposit an atomic layer on the substrate, or an Atomic Layer Etching (ALE) chamber to etch the atomic layer on the substrate. However, the inventive concept is not limited thereto, and a plasma treatment process performed in the process chamber 50 may be variously modified to a known plasma treatment process.

Figure 2:
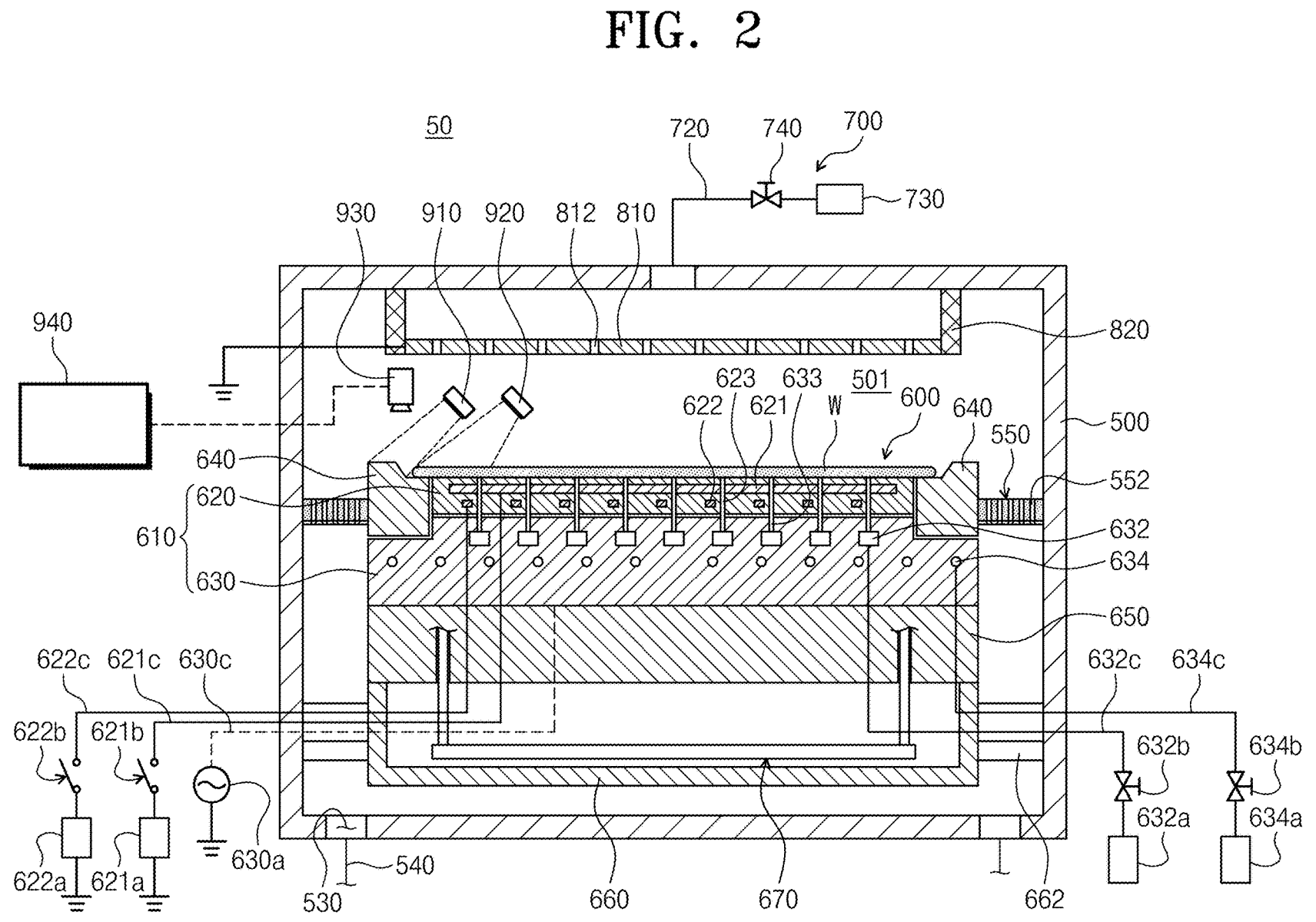
Figure 3:
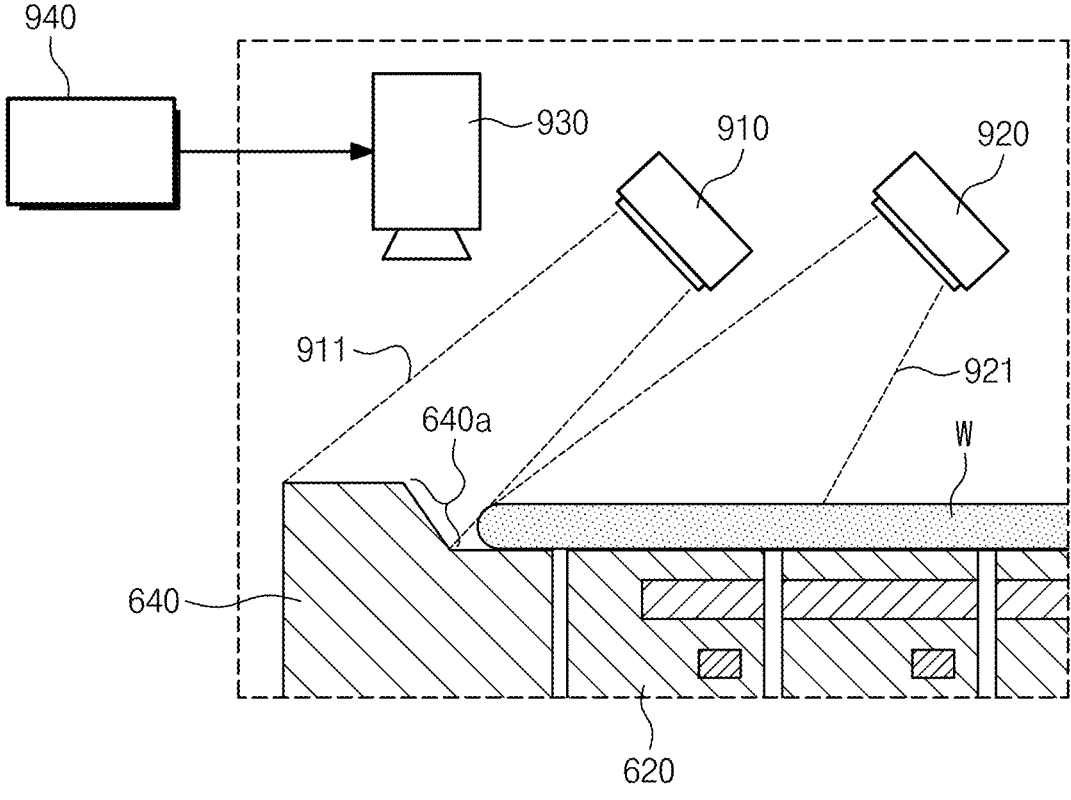
FIG. 3 is an enlarged cross-sectional view around a substrate and a ring member shown in FIG. 2.
Figure 4:
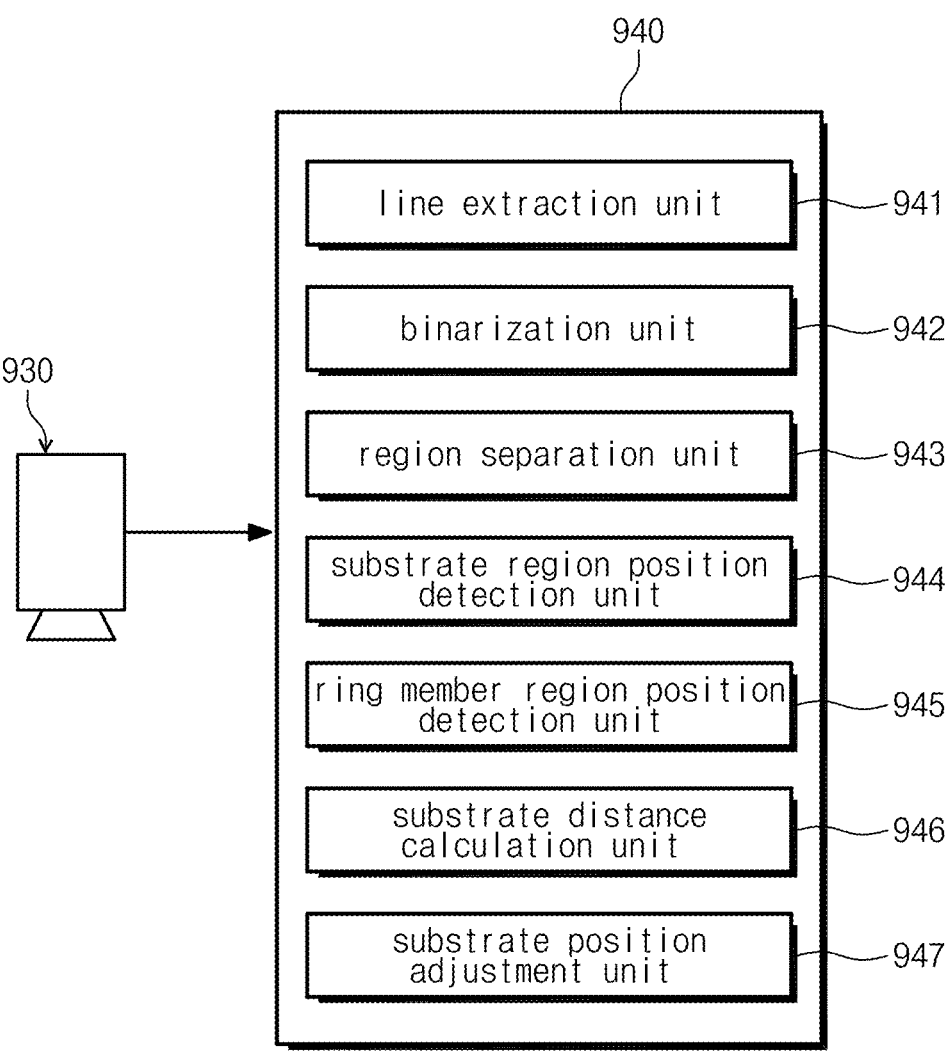
FIG. 4 is a block view of an image analysis unit shown in FIG. 2.
Figure 5:
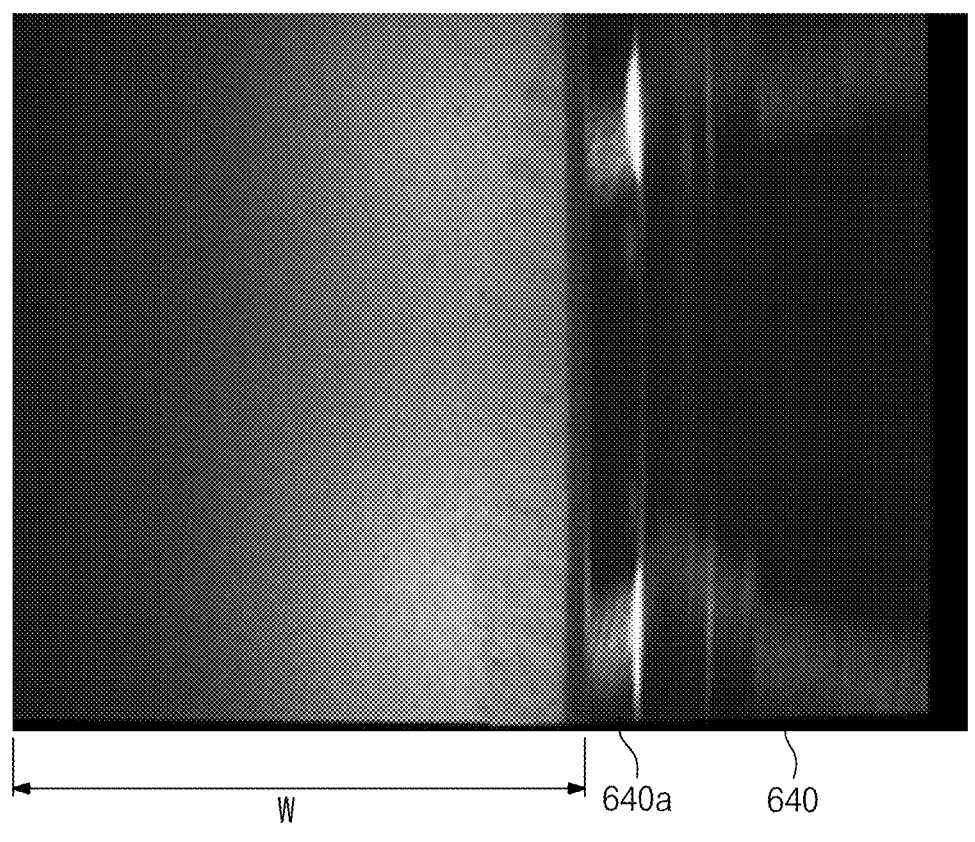
FIG. 5 shows a partial planar image of an image information obtained by the image acquisition unit around the substrate and the ring member in a state in which a first line light source and a second line light source are not irradiated.
Figure 6:
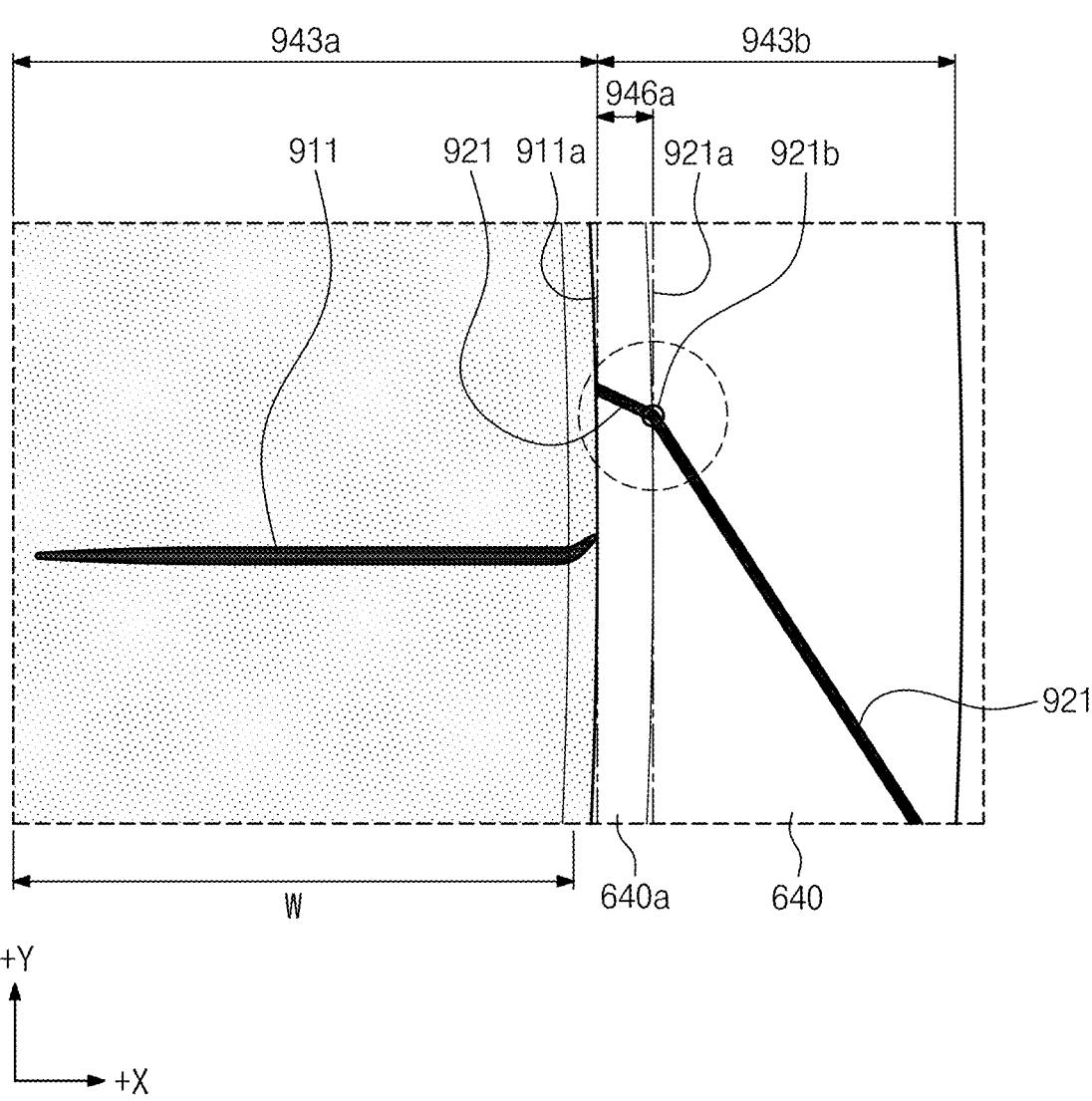
FIG. 6 is a partial plan view of a state in which the first line light source and the second line light source are irradiated to the substrate and the ring member shown in FIG. 5.
Figure 7:
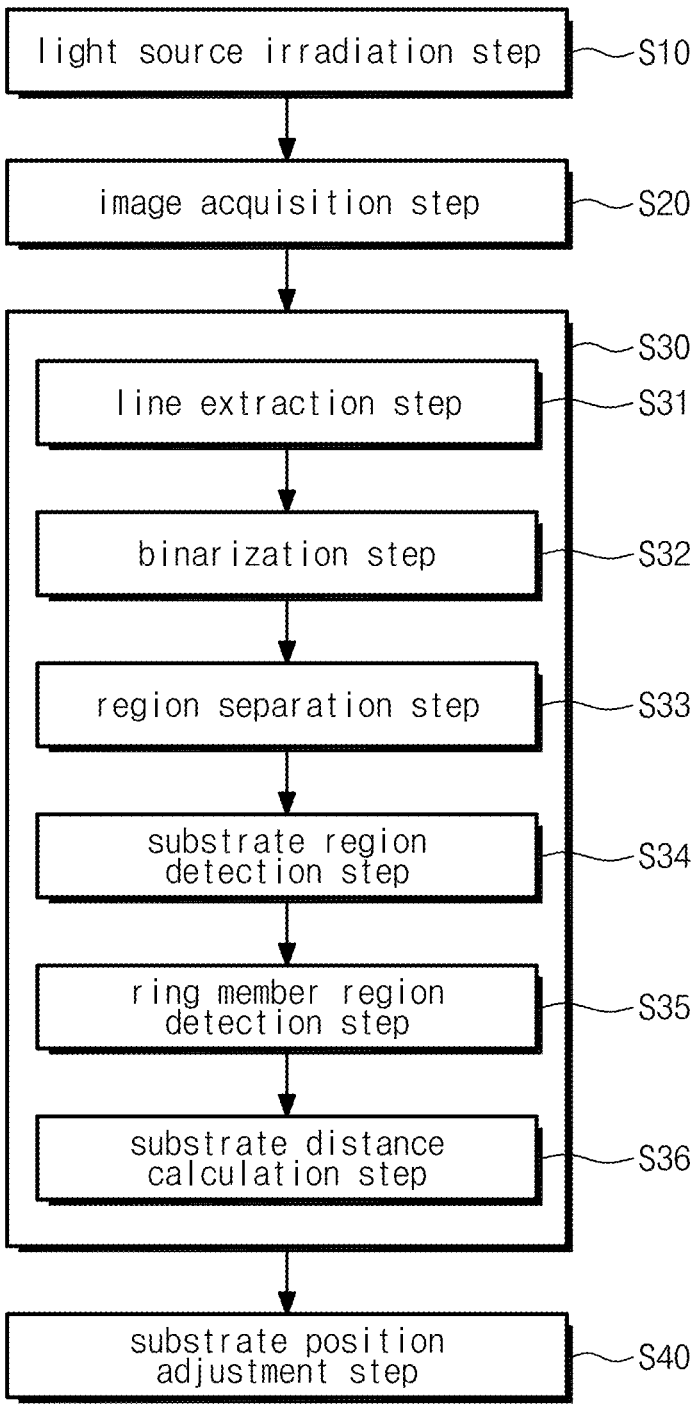
FIG. 7 is a flowchart of a substrate treating method according to an embodiment of the inventive concept.

FIG. 2 is a side cross-sectional view of the process chamber viewed from a lateral direction of an embodiment of FIG. 1. FIG. 3 is an enlarged partial cross-sectional view around the substrate and the ring member shown in FIG. 2. FIG. 4 is a block view of an image analysis unit shown in FIG. 2. FIG. 5 shows a partial planar image of an image information obtained by the image acquisition unit around the substrate and the ring member in a state in which a first line light source and a second line light source are not irradiated. FIG. 6 is a partial plan view of a state in which the first line light source and the second line light source are irradiated to the substrate and the ring member shown in FIG. 5.

Referring further to FIG. 2 to FIG. 6, the process chamber 50 according to an embodiment may perform a plasma treatment on the substrate W. The process chamber 50 includes a housing 500, a support unit 600, a gas supply unit 700, a shower head unit 800, a first light irradiation unit 910, a second light irradiation unit 920, an image acquisition unit 930, and an image analysis unit 940.

The housing 500 may have a shape in which an inside thereof is sealed. The housing 500 has a treating space 501 for treating the substrate W therein. The treating space 501 may be maintained in a substantially vacuum atmosphere while treating the substrate W. A material of the housing 500 may include a metal. According to an embodiment, the material of the housing 500 may include an aluminum. The housing 500 may be grounded.

A taking-in/out opening (not shown) may be formed on a sidewall of the housing 500. The taking-in/out opening (not shown) functions as a space in which the substrate W is taken into or taken out of the treating space 501. The taking-in/out opening (not shown) may be selectively opened and closed by a door assembly which is not shown.

An exhaust hole 530 may be formed on a bottom surface of the housing 500. The exhaust hole 530 is connected to the exhaust line 540. A depressurizing member (not shown) may be installed in the exhaust line 540. The depressurizing member (not shown) may be any one of known pumps providing a negative pressure. A process gas and process impurities supplied to the treating space 501 may be discharged from the treating space 501 through the exhaust hole 530 and the exhaust line 540 sequentially. In addition, since the depressurizing member (not shown) provides the negative pressure, a pressure of the treating space 501 may be adjusted.

An exhaust baffle 550 functioning to more uniformly exhaust the treating space 501 may be disposed above the exhaust hole 530. The exhaust baffle 550 may be positioned between a sidewall of the housing 500 and a support unit 600 to be described later. The exhaust baffle 550 may have a substantially ring shape when viewed from above. At least one baffle hole 552 may be formed in the exhaust baffle 550. The baffle hole 552 may penetrate a top surface and a bottom surface of the exhaust baffle 550. A process gas and process impurities of the treating space 501 may flow to the exhaust hole 530 and the exhaust line 540 through the baffle hole 552.

The support unit 600 is disposed inside the housing 500. The support unit 600 may be disposed in the treating space 501. The support unit 600 may be disposed to be upwardly spaced apart from a bottom surface of the housing 500 by a predetermined distance. The support unit 600 supports the substrate W. The support unit 600 may include an electrostatic chuck which adsorbs the substrate W using an electrostatic force. Alternatively, the support unit 600 may support the substrate W using various methods such as a vacuum adsorption or a mechanical clamping. Hereinafter, the support unit 600 including the electrostatic chuck will be described as an example.

The support unit 600 may include an electrostatic chuck 610, an insulation plate 650, and a bottom cover 660.

The electrostatic chuck 610 supports the substrate W. The electrostatic chuck 610 may include a dielectric plate 620 and a base plate 630. The dielectric plate 620 is positioned at a top end of the support unit 600. The dielectric plate 620 may be a dielectric substance having a disk shape. The substrate W is placed on a top surface of the dielectric plate 620. According to an embodiment, the top surface of the dielectric plate 620 may have a smaller radius than the substrate W. If the substrate W is placed on the top surface of the dielectric plate 620, an edge region of the substrate W may be positioned outside the dielectric plate 620.

An electrode 621 and a heater 622 are disposed within the dielectric plate 620. According to an embodiment, the electrode 621 may be positioned above the heater 622 inside the dielectric plate 620. The electrode 621 is electrically connected to a first power source 621a. The first power source 621a may include a DC power source. A first switch 621b is installed between the electrode 621 and the first power source 621a. If the first switch 621b is turned on, the electrode 621 is electrically connected to the first power source 621a, and a DC current flows through the electrode 621. An electrostatic force is applied between the electrode 621 and the substrate W by a current flowing through the electrode 621. Accordingly, the substrate W is adsorbed on the dielectric plate 620.

The heater 622 is electrically connected to a second power source 622a. A second switch 622b is installed between the heater 622 and the second power source 622a. If the second switch 622b is turned on, the heater 622 may be electrically connected to the second power source 622*a*. The heater 622 may generate a heat by resisting the current supplied from the second power source 622*a*. The heat generated by the heater 622 is transferred to the substrate W via the dielectric plate 620. The substrate W placed on the dielectric plate 620 may maintain a predetermined temperature by the heat generated by the heater 622. The heater 622 may include a coil having a spiral shape. In addition, the heater 622 may include a plurality of coils. Although not shown, the plurality of coils may be provided in different regions of the dielectric plate 620. For example, a coil heating a central region of the dielectric plate 620 and a coil heating an edge region may be embedded in the dielectric plate 620 respectively, and a degree of heat generation between the coils may be independently adjusted. In the above-described example, the heater 622 is positioned within the dielectric plate 620 as an example, but the inventive concept is not limited thereto. For example, the heater 622 may not be positioned within the dielectric plate 620.

At least one first fluid channel 623 may be formed inside the dielectric plate 620. The first fluid channel 623 may be formed from a top surface of the dielectric plate 620 to a bottom surface of the dielectric plate 620. The first fluid channel 623 communicates with a second fluid channel 633 to be described later. If viewed from above, the first fluid channel 623 may be formed to be spaced apart from each other in each of the central region of the dielectric plate 620 and the edge region surrounding the central region thereof. The first fluid channel 623 functions as a passage through which a heat transfer medium to be described later is supplied to a bottom surface of the substrate W.

The base plate 630 is positioned below the dielectric plate 620. The base plate 630 may have a disk shape. A top surface of the base plate 630 may be stepped so that a central region thereof is positioned higher than an edge region. A central region of a top part of the base plate 630 may have an area corresponding to a bottom surface of the dielectric plate 620. The central region of the top surface of the base plate 630 may be adhered to a bottom surface of the dielectric plate 620. A ring member 640 to be described later may be positioned above the edge region of the base plate 630.

The base plate 630 may include a conductive material. For example, a material of the base plate 630 may include an aluminum. The base plate 630 may be a metal plate. For example, an entire region of the base plate 630 may be a metal plate. The base plate 630 may be electrically connected to the third power source 630*a*. The third power source 630*a* may be a high frequency power source generating a high frequency power. For example, the high frequency power source may be an RF power source. The RF power source may be a high bias power RF power source. The base plate 630 receives a high frequency power from the third power source 630*a*. Accordingly, the base plate 630 may function as an electrode generating an electric field. According to an embodiment, the base plate 630 may function as a bottom electrode of a plasma source to be described later. However, the inventive concept is not limited thereto, and the base plate 630 may be grounded to function as a bottom electrode.

A first circulation fluid channel 632 and a second circulation fluid channel 634 may be positioned within the base plate 630. In addition, a second fluid channel 633 may be formed inside the base plate 630.

The first circulation fluid channel 632 may be a passage through which a heat transfer medium circulates. The first circulation fluid channel 632 may have a spiral shape. The first circulation fluid channel 632 is in fluid communication with the second fluid channel 633 to be described later. In addition, the first circulation fluid channel 632 is connected to a first supply source 632*a* through a first supply line 632*c*.

The heat transfer medium is stored in the first supply source 632*a*. The heat transfer medium may include an inert gas. According to an embodiment, the heat transfer medium may include a helium (He) gas. However, the inventive concept is not limited thereto, and the heat transfer medium may include various types of gases or liquids. The heat transfer medium may be a fluid supplied to the bottom surface of the substrate W to resolve a non-uniformity of a temperature of the substrate W while performing a plasma treatment on the substrate W. In addition, the heat transfer medium may serve as a medium for transferring a heat transferred from the plasma to the substrate W, to the dielectric plate 620 and the ring member 640 to be described later from the substrate W, while the plasma treatment is performed on the substrate W.

A first valve 632*b* is installed in the first supply line 632*c*. The first valve 632*b* may be an opening/closing valve. As the first valve 632*b* is opened and closed, the heat transfer medium may be selectively supplied to the first circulation fluid channel 632.

The second fluid channel 633 fluidly communicates the first circulation fluid channel 632 with the first fluid channel 623. The heat transfer medium supplied to the first circulation fluid channel 632 may be supplied to the bottom surface of the substrate W through the second fluid channel 633 and the first fluid channel 623 sequentially.

The second circulation fluid channel 634 may be a passage through which a cooling fluid circulates. The second circulation fluid channel 634 may have a spiral shape. In addition, the second circulation fluid channel 634 may be disposed such that ring-shaped fluid channels having different radii share the same center with each other. The second circulation fluid channel 634 is connected to the second supply source 634*a* through the second supply line 634*c*.

The cooling fluid is stored in the second supply source 634*a*. For example, the cooling fluid may be provided as cooling water. A cooler (not shown) may be provided to the second supply source 634*a*. The cooler (not shown) may cool the cooling fluid to a predetermined temperature. However, unlike the above-described example, the cooler (not shown) may be installed in the second supply line 634*c*.

A second valve 634*b* is installed in the second supply line 634*c*. The second valve 634*b* may be an opening/closing valve. The cooling fluid may be selectively supplied to the second circulation fluid channel 634 according to the opening and closing of the second valve 634*b*. The cooling fluid is supplied to the second circulation fluid channel 634 through the second supply line 634*c*. The cooling fluid flowing through the second circulation fluid channel 634 may cool the base plate 630. The substrate W may be cooled together through the base plate 630.

The ring member 640 is disposed in an edge region of the electrostatic chuck 610. According to an embodiment, the ring member 640 may be a focus ring. The ring member 640 has a ring shape. The ring member 640 is disposed along a circumference of the dielectric plate 620. For example, the ring member 640 may be disposed above the edge region of the base plate 630.

A top surface of the ring member 640 may be formed to be stepped. According to an embodiment, an inner portion of the top surface of the ring member 640 may be positioned at the same height as the top surface of the dielectric plate 620. In addition, the inner portion of the top surface of the ring member 640 may support a bottom surface of the edge region of the substrate W positioned outside the dielectric plate 620. An outer portion of the top surface of the ring member 640 may surround a side surface of the edge region of the substrate W. In addition, for the ring member 640, a surface on which a step 640*a* is formed has a right angle or an obtuse angle with the top surface.

An insulation plate 650 is positioned below the base plate 630. The insulation plate 650 may include an insulating material. The insulation plate 650 electrically insulates the base plate 630 from a bottom cover 660 to be described later. The insulation plate 650 may have a substantially disk shape when viewed from above. The insulation plate 650 may have an area corresponding to that of the base plate 630.

The bottom cover 660 is positioned below the insulation plate 650. The bottom cover 660 may have a cylindrical shape with an open top surface when viewed from above. A top surface of the bottom cover 660 may be covered by the insulation plate 650. A lift pin assembly 670 for lifting and lowering the substrate W may be positioned in an inner space of the bottom cover 660.

The bottom cover 660 may include a plurality of connection members 662. The connection member 662 may connect an outer surface of the bottom cover 660 to an inner wall of the housing 500. The plurality of connection members 662 may be disposed to be spaced apart along a circumferential direction of the bottom cover 660. The connection member 662 supports the support unit 600 within the housing 500. In addition, the connection member 662 may be connected to a grounded housing 500 to ground the bottom cover 660.

The connection member 662 may have a hollow shape having a space therein. The first power line 621*c* connected to the first power source 621*a*, the second power line 622*c* connected to the second power source 622*a*, the third power line 630*c* connected to the third power source 630*a*, the first supply line 632*c* connected to the first circulation fluid channel 632, and the second supply line 634*c* connected to the second circulation fluid channel 634 extend to an outside of the housing 500 through an inner space of the connection member 662.

The gas supply unit 700 supplies a process gas to the treating space 501. The gas supply unit 700 may include a gas supply nozzle 710, a gas supply line 720, and a gas supply source 730.

The gas supply nozzle 710 may be installed in a central region of a top surface of the housing 500. An injection hole is formed on a bottom surface of the gas supply nozzle 710. The injection port (not shown) may inject the process gas into the housing 500.

An end of the gas supply line 720 is connected to the gas supply nozzle 710. The other end of the gas supply line 720 is connected to the gas supply source 730. The gas supply source 730 may store the process gas. The process gas may be a gas which is excited in a plasma state by a plasma source to be described later. According to an embodiment, the process gas may include an $NH_3$, an $NF_3$, and/or an inert gas.

A gas valve 740 is installed in the gas supply line 720. The gas valve 740 may be an opening/closing valve. The process gas may be selectively supplied to the treating space 501 according to the opening and closing of the gas valve 740.

The plasma source excites the process gas supplied into the housing 500 into a plasma state. A Capacitive Coupled Plasma (CCP) is used as the plasma source in accordance with an embodiment of the inventive concept. However, the inventive concept is not limited thereto, and the process gas supplied to the treating space 501 may be excited into a plasma state using an inductively coupled plasma (ICP) or a microwave plasma. Hereinafter, a case in which capacitance-coupled plasma (CCP) is used as a plasma source according to an embodiment will be described as an example.

The plasma source may include a top electrode and a bottom electrode. The top electrode and the bottom electrode may be disposed to face each other within the housing 500. One of both electrodes may apply a high-frequency power, and the other electrode may be grounded. Alternatively, the high frequency power may be applied to both electrodes. An electric field is formed in a space between both electrodes, and the process gas supplied to the space may be excited in a plasma state. A substrate treating process is performed using the plasma. According to an embodiment, the top electrode may be an electrode plate 830 to be described later, and the bottom electrode may be the base plate 630 described above.

The shower head unit 800 is positioned above the support unit 600 within the housing 500. The shower head unit 800 may include a shower plate 810 and a support portion 820.

The shower plate 810 is positioned on a top side of the support unit 600 to face the support unit 600. The shower plate 810 may be positioned to be downwardly spaced apart from a ceiling surface of the housing 500. According to an embodiment, the shower plate 810 may have a disk shape having a constant thickness. The shower plate 810 is disposed to be downwardly spaced apart from the ceiling surface of the housing 500 by a predetermined distance, and a space may be formed between the shower plate 810 and the ceiling surface of the housing 500. In addition, a plurality of holes 811 are formed in the shower plate 810. The plurality of holes 811 disperse and pass the process gas supplied from the gas supply nozzle 710.

In addition, a material of the shower plate 810 may include a metal. The shower plate 810 may be grounded. In the embodiment, the shower plate 810 is used as a top electrode. However, in the inventive concept, the shower plate 810 is not limited to being used only as the top electrode, and the top electrode may be installed as a separate electrode member.

The support portion 820 supports a side portion of the shower plate 810 and a side portion of the electrode plate 830, respectively. A top end of the support portion 820 is connected to a ceiling surface of the housing 500, and a bottom portion of the support portion 820 is connected to a side portion of the shower plate 810 and a side portion of the electrode plate 830, respectively. A material of the support portion 820 may include a non-metal.

The first light irradiation unit 910 includes a first light source (not shown), a body (not shown) coupled around the first light source to fix the first light source, and a light circuit unit (not shown) which supplies a power to the first light source. However, in the inventive concept, detailed configurations of the first light irradiation unit 910 are not limited to the above-described method, and the first light irradiation unit 910 may be modified in any form capable of irradiating the first light source. The first light irradiation unit 910 is disposed inside the housing 500. In this case, the first light irradiation unit 910 may be attached to a transfer apparatus for transferring the substrate W such as the first transfer robot 240 and the second transfer robot 340, or may be configured to modify a position as necessary while being coupled to an inside of the housing 500. However, in the inventive concept, an arrangement position of the first light irradiation unit 910 is not limited to the above-described method, and can be modified and disposed in various forms.

In addition, the first light source of the first light irradiation unit 910 is formed of the first line light source 911 and irradiates a light in a line form on the top surface of the substrate W. In the embodiment, it is illustrated that the first line light source 911 is formed of a laser. However, in the inventive concept, the first line light source 911 generated by the first light irradiation unit 910 is not limited to a laser, and may be modified into all light sources which may be irradiated in a line form if a light is irradiated. As described above, the first light irradiation unit 910 irradiates the substrate W with the first line light source 911. In addition, the first light irradiation unit 910 irradiates the substrate W with a light obliquely on the top surface of the substrate W if irradiating the first line light source 911 to the substrate W, and forms so a focus of the first line light source 911 coincides with the top surface of the substrate W, so that a width or a direction of the first light source 11 appears in a different form at a different height with respect to a top surface height of the substrate W if the first light source is irradiated to a region of a different height. Therefore, the first line light source 911 is irradiated to form a first line light source 911 which thickness and direction are within a certain error range on the top surface of the substrate W, and the first line light source 911 with a different width and direction appears in a region outside the substrate W, which is another region which does not match the height of the top surface of the substrate W. In addition, in the case of the embodiment, the first line light source 911 is formed to have a red wavelength. However, in the inventive concept, the first line light source 911 is not limited to a red series, and may be formed in various color series. Meanwhile, a flat zone may be formed near an edge of the substrate W, and in this case, the first line light source 911 may appear in a form in which a partial region is refracted near the flat zone.

The second light irradiation unit 920 includes a second light source (not shown) which irradiates a light, a body (not shown) which is coupled around the second light source to fix the second light source, and a light circuit unit (not shown) which supplies a power to the second light source. However, in the inventive concept, detailed configurations of the second light irradiation unit 920 are not limited to the above-described method, and the second light irradiation unit 920 may be modified and implemented in all forms capable of irradiating a light source. The second light irradiation unit 920 is disposed within the housing 500. In this case, the second light irradiation unit 920 may be attached to a transfer apparatus for transferring the substrate W such as the first transfer robot 240 and the second transfer robot 340, or may be configured to move inside and outside of the housing 500 as necessary while coupled to an inside of the housing 500. In addition, a plurality of second light irradiation units 920 may be configured as necessary. However, the inventive concept does not limit an arrangement position and the number of configurations of the second light irradiation unit 920 to the above-described method, and may be modified in various shapes and numbers. In addition, the second light source of the second light irradiation unit 920 is formed as a second line light source 921, and irradiates a light to the top surface of the ring member 640 in a line form. In the present embodiment, it is illustrated that the second line light source 921 is formed of a laser. However, in the inventive concept, the second line light source 921 generated by the second light irradiation unit 920 is not limited to a laser, and may be modified into all light sources that may be irradiated in a line form when a light is irradiated. As described above, the second light irradiation unit 920 irradiates the ring member 640 with the second line light source

921. In addition, if irradiating the ring member 640 with the first line light source 911, the second light source 920 irradiates the top surface of the ring member 640 obliquely with the light and is formed so that a focus of the second line light source 921 matches the top surface of the ring member 640, and if the second line light source 921 is irradiated to a region corresponding to a different height based on a height of the top surface of the ring member 640, a width or a direction of the second line light source 921 is formed in a different form. Therefore, the second line light source 921 is irradiated, and a second line light source 921 with a thickness and direction within a certain error range is formed on the top surface of the ring member 640, and the second line light source 921 having a different width and direction appears at a region at which a top surface height of the ring member 640 does not match. In this embodiment, since an inner side of the ring member 640 is formed to have a step 640*a* toward a center of a circle, a direction of the second line light source 921 irradiated to the top surface of the ring member 640 and a direction of the second line light source 921 irradiated to a region at which the step 640*a* of the ring member 640 is formed are irradiated in a bent form between one another from a point at which the step 640*a* starts. In addition, in the embodiment, the second line light source 921 is formed to have a red wavelength. However, in the inventive concept, the second line light source 921 is not limited to a red series, and may be formed in various color series.

The image acquisition unit 930 includes a camera (not shown) and a fixing module (not shown) for fixing the camera. However, in the inventive concept, detailed configurations of the image acquisition unit 930 are not limited to the above-described methods, and may be variously modified and implemented in a form in which an image information may be obtained by imaging. In addition, the image acquisition unit 930 may be attached to a transfer apparatus that transfers the substrate W, such as the first transfer robot 240 and the second transfer robot 340, or may be attached to a mechanism (not shown) which moves inside and outside of the housing 500 as necessary. However, in the inventive concept, an arrangement position and movement method of the image acquisition unit 930 are not limited to the above-described method, and may be arranged and moved in various forms to obtain the image information. The image acquisition unit 930 acquires the image information by imaging the substrate W irradiated with the first line light source 911 and the ring member 640 irradiated with the second line light source 921. In this case, if the first line light source 911 and the second line light source 921 are irradiated, the image acquisition unit 930 may obtain the image information in a dark room atmosphere to improve a discrimination power of the first line light source 911 and the second line light source 921.

The image analysis unit 940 receives the image information including the first line light source 911 and the second line light source 921 from the image acquisition unit 930 in connection with the image acquisition unit 930, analyzes the first line light source 911 and the second line light source 921 within the input image information, and extracts a distance between an outermost region of the substrate W and an inner side region of the ring member 640, so a separation value is transmitted to the transfer apparatus to adjust a position of the substrate.

As an embodiment of such an image analysis unit 940, the image analysis unit 940 includes a line extraction unit 941, a binarization unit 942, a region separation unit 943, a substrate region position detection unit 944, a ring member region position detection unit 945, a substrate distance calculation unit 946, and a substrate position adjustment unit 947.

The line extraction unit 941 merges the R channel and the G channel in the RGB channel of the image information which is input from the image acquisition unit 930 to make a region except the first line light source 911 and the second line light source 921 black, and applies a noise filter to remove a noise element which is greatly deviating from a line center of the first line light source 911 and the second line light source 921. In this way, the line extraction unit 941 extracts a line image so that the first line source 911 and the second line source 921 within the image information appear in a line form.

The binarization unit 942 receives a line image in connection with the line extraction unit 941 and binarizes a region at which the first line light source 911 and the second line light source 921 exist within a received line image into white, and a region at which the first line light source 911 and the second line light source 921 do not exist into black. Accordingly, a region at which the first line light source 911 and the second line light source 921 exist in the line image is expressed in white, and a region at which the first line light source 911 and the second line light source 921 do not exist is expressed in black. Here, white and black may be transformed into various colors. In this case, the region formed in white forms a coordinate value for each pixel. Accordingly, the first line light source 911 and the second line light source 921 within the line image are binarized by the binarization unit 942, and each pixel is formed as a coordinate image with only a coordinate value.

The region separation unit 943 receives a coordinate image from the binary image unit 942, and separates a first interest region image with the first line light source 911 among the received coordinate images and a second interest region image with the second line light source 921. Regarding a separation of the first interest region image and the second interest region image, if a right side to a left side of the image information is referred to as a +X axis and a bottom side and a top side is referred to as a +Y axis, the left side is separated as an interest region image 943a and the right side is separated as a second interest region image 943b with respect to a coordinate value of a point at which the first line light source ends in the +X axis direction.

The substrate region position detection unit 944 receives the first interest region image from the region separation unit 943 and detects the position of the substrate W through the X-direction coordinate value 911a at an end of the first interest region image within the first interest region image. Here, a coordinate value of the point at which the first line light source 911 ends corresponds to a topmost value which is the point at which the first line light source 911 ends in the +X direction within the image information.

The ring member region position detection unit 945 receives the second interest region image from the region separation unit 943 and detects a position of the ring member through the X-direction coordinate value 921a of a point 921b at which the second light sources 921 in the second interest region image cross each other. Here, the point at which the second light sources 921 cross each other 921b is a point at which a step 640a of the ring member 640 starts and directions of the second light sources 921 are changed if the second line light source 921 is irradiated. In this case, the ring member region position detection unit 945 may convert the second line light sources 921 into coordinated lines using a RANSAC line estimation among a numerical interpolation to express center points as coordinate values, and detect the position of the ring member through an intersection of the coordinated lines. However, in the inventive concept, a numerical interpolation method for coordinating the second light sources 921 into lines is not limited to a RANSAC line estimation, and it goes without saying that the second light sources 921 can be coordinated through various numerical interpolation methods.

The substrate distance calculation unit 946 calculates a distance 946a between the substrate W and the ring member 640 by a difference between an X-direction coordinate value 911a at the point at which the first line light source 911 detected in the substrate region position detection unit 944 ends, and X-direction coordinate value 921a at a point at which the second line light sources 921 detected from the ring member region position detection unit 945 cross each other.

The substrate position adjustment unit 947 calculates a separation value for how much the distance value 946a between the substrate W and the ring member 640 deviates from a preset reference value through the substrate distance calculation unit 946, and transmits the separation value to the transfer apparatus which adjusts the position of the substrate W if the calculated value deviates from a preset deviation value, to adjust the position of the substrate W.

Hereinafter, a substrate treating method of a substrate treating apparatus according to an embodiment of the inventive concept as described above will be described.

Referring further to FIG. 9, FIG. 9 is a flowchart of a substrate treating method according to an embodiment of the inventive concept.

Referring further to FIG. 9, the substrate treating method according to an embodiment of the inventive concept includes a light source irradiation step S10, an image acquisition step S20, an image analysis step S30, and a substrate position adjustment step S40.

In the light source irradiation step S10, a first light irradiation unit 910 irradiates the substrate W with the first line light source 911 and the second line light source 921 is irradiated from a second light irradiation unit 920 to the ring member 640. In this case, as described above, each of the first line light source 911 and the second line light source 921 may irradiate a line-shaped laser light source in a diagonal direction. In this case, the first line light source 911 irradiated to the substrate W is formed in a shape in which a partial region is bent near a flat zone.

In the image analysis step S30, the image analysis unit 940 receives the image information from the image acquisition unit 930, analyzes the input image information to extract a distance value between an outermost region of the substrate W and the inner region of the ring member 640, calculates a separation distance which is deviated from a certain distance from a reference distance value, and transmits the distance value to the transfer apparatus so the position of the substrate W may be adjusted.

More specifically, the image analysis step S30 includes a line extraction step S31, a binarization step S32, a region separation step S33, a substrate region detection step S34, a ring member region detection step S35, and a substrate distance calculation step S36.

First, in the line extraction step S31, the line extraction unit 941 generates a line image by applying a noise filter and removing a noise element which has greatly deviated from a line center of the first line light source 911 and a second line light source 921, in a state in which an R channel and a G channel is coupled in an RGB channel of an image information which is input from the image acquisition unit 930 so a region except from the first line light source 911 and the second line light source 921 is configured to be a black region.

Next, in the binarization step S32, the binarization unit 942 receives a line image in connection with the line extraction unit 941, and generates a coordinate image having a coordinate value by being input with the line image, and binarizing a region at which the first line light source 911 and the second line light source 921 exist within the input line image into white, and a region at which the first line light source 911 and the second line light source 921 do not exist into black.

Next, in the region separation step S33, the region separation unit 943 receives a coordinate image from the binary image unit 942, divides an input coordinate image into a first interest region image 943a in which the first line light source 911 exists and a second interest region image 921 exists. In this case, in the region separation step S33, the first interest region image 943a and the second interest region image 943b are divided based on a X-direction coordinate value 911a at which the first line light source 911 ends.

Next, in the substrate region detection step S34, the substrate region position detecting unit 944 receives the first interest region image 943a from the region separation unit 943, and detects the position of the substrate W through a rightmost coordinate value 911a, which is the end point of the first line light source 911 within the first interest region image 943a.

Next, in the ring member region detection step S35, the ring member position detection unit 945 receives the second interest region image from the region separation unit 943, and detects a position of the ring member through an X-direction coordinate value 921a of a point at which the second interest region images 921b cross each other within the second interest region image. Here, a point at which the second light sources 921 cross each other is a point at which a step 640a of the ring member 640 starts and directions of the second light sources 921 change if the second line light source 921 is irradiated.

Next, in the substrate distance calculation step S36, the substrate distance calculation unit 946 calculates the X-direction coordinate value 911a at the end of the first line light source 911 detected in the substrate region position detection unit 944 and X-direction coordinate value 921a of a point at which the second line light sources intersect with each other by the ring member position detection unit 945, to calculate a distance 946a therebetween, and to calculate a distance between the substrate W and the ring member 640.

Next, in the substrate position adjustment step S40, the substrate position adjustment unit 947 calculates a separation value (not shown) of how much a distance value 946a between the substrate W and the ring member 640 deviates from a preset reference value through the substrate distance calculation unit 946, and if the calculated separation value deviates from a preset error range, the separation value is transmitted to the transfer apparatus for adjusting the position of the substrate to adjust and aligning the position of the substrate W.

As described above, since the substrate treating device and the substrate treating method according to an embodiment of this invention determines the position of the substrate W through the distance value 640a of the ring member 640, it is possible to detect the exact position of the substrate W by changing the image information without changing the structure or dimension of the ring member 640.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating apparatus comprising:
a support configured to seat a substrate;
a first light irradiator configured to irradiate a first light source onto the substrate in a line form;
an image acquisition unit configured to acquire first image information with respect to the first light source irradiated onto the substrate in a line form; and
an image analyzer configured to detect a position of the substrate by inputting the image information and analyzing a form of the first light source irradiated onto the substrate based on the image information.

2. The substrate treating apparatus of claim 1, further comprising:
a ring member positioned around the support; and
a second light irradiator configured to irradiate a second light source onto the ring member in a line form, and
wherein the image acquisition unit is further configured to acquire second image information with respect to the ring member while the second light source is irradiated onto the ring member, and
the image analyzer being further configured to be input the second image information and detect a position of the ring member by analyzing a form of the second light source which is irradiated to the ring member.

3. The substrate treating apparatus of claim 2, wherein the first light source is irradiated in a diagonal direction onto the substrate, and the second light source is irradiated in a diagonal direction onto the ring member.

4. The substrate treating apparatus of claim 3, wherein the ring member further includes a step which is formed in a substrate direction, and
the second light source is formed in an intersection point from which the step starts to the other direction, if irradiated to the ring member.

5. The substrate treating apparatus of claim 4, wherein the image analyzer is configured to calculate a separation value of how much an extracted distance value, which is a distance value from a point at which the first light source ends on the substrate within the first image information and the intersection point, is spaced apart from a reference distance value.

6. The substrate treating apparatus of claim 5, wherein the image analyzer further includes a line extractor configured to generate a line image by applying a noise filter and removing a noise element which has deviated from a line center of the first light source and a second light source, in a state in which an R channel and a G channel is coupled in an RGB channel of the first image information so a region except from the first light source and the second light source is configured to be a black region.

7. The substrate treating apparatus of claim 6, wherein the image analyzer further includes a binarizator configured to binarize a region at which the first light source and the second light source exist within an input line image to be white, and a region at which the first light source and the second light do not exist to be black, once the line image is input by communicating with the line extractor.

8. The substrate treating apparatus of claim 7, wherein the image analyzer further includes a region separator which is input with a coordinate image from the binarizator and divides the coordination image which is input to a first interest region image at which the first line light source exists and a second interest region image at which the second line light source exists.

9. The substrate treating apparatus of claim 8, wherein the image analyzer includes:

a substrate region position detector configured to detect a position of the substrate by being input with the first interest region image from the region separator and then detecting through a coordinate value of a point at which the first line light source ends within the first interest region image, and a ring member region position detector is configured to detect a position of the ring member based on the second interest region image from the region separator and then detecting through a coordinate value of a point at which the second line light sources intersect with each other within the second interest region image.

10. The substrate treating apparatus of claim 9, wherein the image analyzer further includes a substrate distance calculator configured to calculate a distance value between a coordinate value of a point at which the first light source ends which is detected at the substrate region position detector, and a coordinate value of a point at which the second light sources intersect with each other which is detected at the ring member region position detector.

11. The substrate treating apparatus of claim 10, wherein the image analyzer further includes a substrate position adjuster configured to align to thereby adjust the position of the substrate by transmitting a separation value to a transfer apparatus for adjusting the position of the substrate, if the separation value is calculated by calculating how much the distance value calculated through the substrate distance calculator deviates from a predetermined deviation value, and the separation value deviates from the predetermined deviation value.

12. A substrate treating apparatus comprising:

a support configured to seat a substrate;

a first light irradiator configured to irradiate a first light source in a line form onto the substrate in a diagonal direction;

a ring member positioned around the support and having a step formed in an inner edge;

a second light source configured to irradiate a second light source in a line form in a diagonal direction and so an intersection is formed so a direction of the second light source is bent in another direction at a point at which the step starts;

an image acquisition unit configured to acquire first image information of the first light source which is irradiated onto the substrate and the second light source which is irradiated onto the ring member; and an image analyzer including, a line extractor which generates a line image by applying a noise filter and removing a noise element which has deviated from a line center of a first line light source and a second line light source, in a state in which an R channel and a G channel is coupled in an RGB channel of image information which is input from the image acquisition unit so a region except from the first line light source and the second line light source is configured to be a black region;

a binarizator configured to binarize a region at which the first line light source and the second line light source exist within an input line image to be a first color, and a region at which the first line light source and the second line light do not exist to be a second color, after the line image is input by communicating with the line extractor;

a region separator which is input with a coordinate image from the binarizator and divides the coordination image which is input to a first interest region at which the first line light source exists and a second interest region at which the second line light source exists;

a substrate region position detector which detects a position of the substrate by being input with a first interest region image from the region separator and then detecting through a coordinate value of a point at which the first line light source ends within the first interest region image;

a ring member region position detector which detects a position of the ring member by being input with a second interest region image from the region separator and then detecting through a coordinate value of a point at which the second line light sources intersect with each other within the second interest region image;

a substrate distance calculator which calculates a distance value between a coordinate value of a point at which the first line light source ends which is detected at the substrate region position detector, and a point at which the second line light sources intersect with each other which is detected at the ring member region position detector; and a substrate position adjuster which aligns to thereby adjust the position of the substrate by transmitting a separation value to a transfer apparatus for adjusting the position of the substrate, if the separation value is calculated by calculating how much the distance value calculated through the substrate distance calculator deviates from a predetermined deviation value, and the separation value deviates from the predetermined deviation value.

* * * * *